(12) United States Patent
Poust et al.

(10) Patent No.: US 9,774,067 B2
(45) Date of Patent: Sep. 26, 2017

(54) LOW POWER THRESHOLD INTEGRATED MICRO-PLASMA LIMITER

(71) Applicant: NORTHROP GRUMMAN SYSTEMS CORPORATION, Falls Church, VA (US)

(72) Inventors: Benjamin D. Poust, Hawthorne, CA (US); Michael Conrad Battung, Harbor City, CA (US); Dino Ferizovic, Torrance, CA (US); Patty P. Chang-Chien, Hermosa Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 361 days.

(21) Appl. No.: 14/708,838

(22) Filed: May 11, 2015

(65) Prior Publication Data

US 2015/0244048 A1 Aug. 27, 2015

Related U.S. Application Data

(63) Continuation-in-part of application No. 13/865,921, filed on Apr. 18, 2013, now Pat. No. 9,054,500.

(60) Provisional application No. 61/653,840, filed on May 31, 2012.

(51) Int. Cl.
| | |
|---|---|
| *H01P 1/14* | (2006.01) |
| *H01T 4/08* | (2006.01) |
| *H01T 4/16* | (2006.01) |
| *H03G 11/00* | (2006.01) |
| *H01L 23/60* | (2006.01) |
| *H01T 19/04* | (2006.01) |

(52) U.S. Cl.
CPC .................. *H01P 1/14* (2013.01); *H01T 4/08* (2013.01); *H01T 4/16* (2013.01); *H03G 11/002* (2013.01); *H03G 11/004* (2013.01); *H01L 23/60* (2013.01); *H01L 2924/0002* (2013.01); *H01T 19/04* (2013.01)

(58) Field of Classification Search
CPC ..... H01P 1/14; H01T 4/08; H01T 4/16; H01T 19/04; H03G 11/002; H03G 11/004; H01L 23/60; H01L 2924/0002; H01L 2924/00
USPC ........................................................ 361/112
See application file for complete search history.

(56) References Cited

U.S. PATENT DOCUMENTS

| | | | |
|---|---|---|---|
| 6,606,230 B2 * | 8/2003 | Sawada ..................... | H01T 4/12 174/256 |
| 2011/0211289 A1 * | 9/2011 | Kosowsky .......... | H01L 27/0288 361/91.1 |

* cited by examiner

*Primary Examiner* — Thienvu Tran
*Assistant Examiner* — Kevin J Comber
(74) *Attorney, Agent, or Firm* — John A. Miller; Miller IP Group, PLC

(57) ABSTRACT

A plasma power limiter fabricated using wafer-level fabrication techniques with other circuit elements. The power limiter includes a signal substrate having a first side and a second side, an input signal line formed on the first side, a signal transmission line formed on the second side and an output signal line formed on the first side. The power limiter also includes a ground substrate having a first side and a second side, and being bonded to the signal substrate to form a sealed cavity including an ionizable gas therebetween. The ground substrate includes a ground metal layer formed on the second side. A signal propagating on the input signal line at a power level greater than a threshold power level generates a voltage potential across the cavity that ionizes (Continued)

the gas and generates a plasma discharge, and limits power of the output signal coupled to the output signal line.

24 Claims, 7 Drawing Sheets

LOW POWER THRESHOLD INTEGRATED MICRO-PLASMA LIMITER

CROSS-REFERENCE TO RELATED APPLICATIONS

This application is a continuation-in-part application of U.S. patent application Ser. No. 13/865,921, titled INTEGRATED MICRO-PLASMA LIMITER, filed Apr. 18, 2013, which claimed the benefit of the priority date of U.S. Provisional Patent Application Ser. No. 61/653,840, titled INTEGRATED MICRO-PLASMA LIMITER, filed May 31, 2012.

BACKGROUND

Field

This invention relates generally to a plasma power limiter and, more particularly, to a plasma power limiter that is monolithically fabricated using wafer-level processing so as to be integrated on the same wafer as other circuits.

Discussion of the Art

It is known in the art to provide wafer-level packaging for integrated circuits, such as monolithic millimeter-wave integrated circuits (MMIC), formed on substrate wafers. In one wafer-level packaging design, a cover wafer is mounted to the substrate wafer using a bonding ring so as to provide a hermetically sealed cavity in which the integrated circuit is provided. Typically, many integrated circuits are formed on the substrate wafer and covered by a single cover wafer, where each integrated circuit is surrounded by a separate bonding ring. The cover wafer and the substrate are then diced between the bonding rings to separate the packages for each separate integrated circuit. The dicing process typically requires the use of a saw that cuts the cover wafer between the packages, where a portion of the cover wafer is removed. The substrate wafer is then cut between the packages.

Integrated circuits can be susceptible to high intensity or high power signals, such as electromagnetic pulses (EMP), whether they are unintended random signals or intentional hostile signals. For example, high performance electronic circuits used in many receivers may be sensitive to high power input signals. Particularly, low noise amplifiers (LNA) provided immediately behind the antenna at the front end of a receiver can be destroyed if the antenna receives a high intensity power signal, where the power susceptibility of the LNA becomes more sensitive to incoming power as the frequency and noise performance of the receiver increases.

In order to address this concern related to the damaging effects of high power signals, plasma power limiters have been developed in the art that are provided at the front end of these types of circuits. A typical plasma power limiter will include a sealed cavity in which is encapsulated a suitable ionizable gas, such as argon, that when ionized generates a plasma discharge that allows electrical current to propagate therethrough. If the incoming signal is of a high enough intensity where the gas is ionized, current generated by the signal can be directed through the plasma to a sinking electrode, where it can harmlessly be sent to a ground potential.

Known plasma power limiters are typically separate bulky devices provided at the front end of the receiver or other circuit that cause significant signal loss before the signal can be amplified for further processing. Therefore, for some applications the design of the specific circuit would not allow for such a power limiter to be incorporated.

DETAILED DESCRIPTION OF THE EMBODIMENTS

The following discussion of the embodiments of the invention directed to integrated wafer-level plasma power limiters is merely exemplary in nature, and is in no way intended to limit the invention or its applications or uses. For example, the discussion herein is directed to the plasma power limiters being employed in the front end of a receiver. However, as will be appreciated by those skilled in the art, the plasma power limiters discussed herein can be used in any suitable circuit that includes electronics that could be damaged by high intensity signals.

Figure 1:
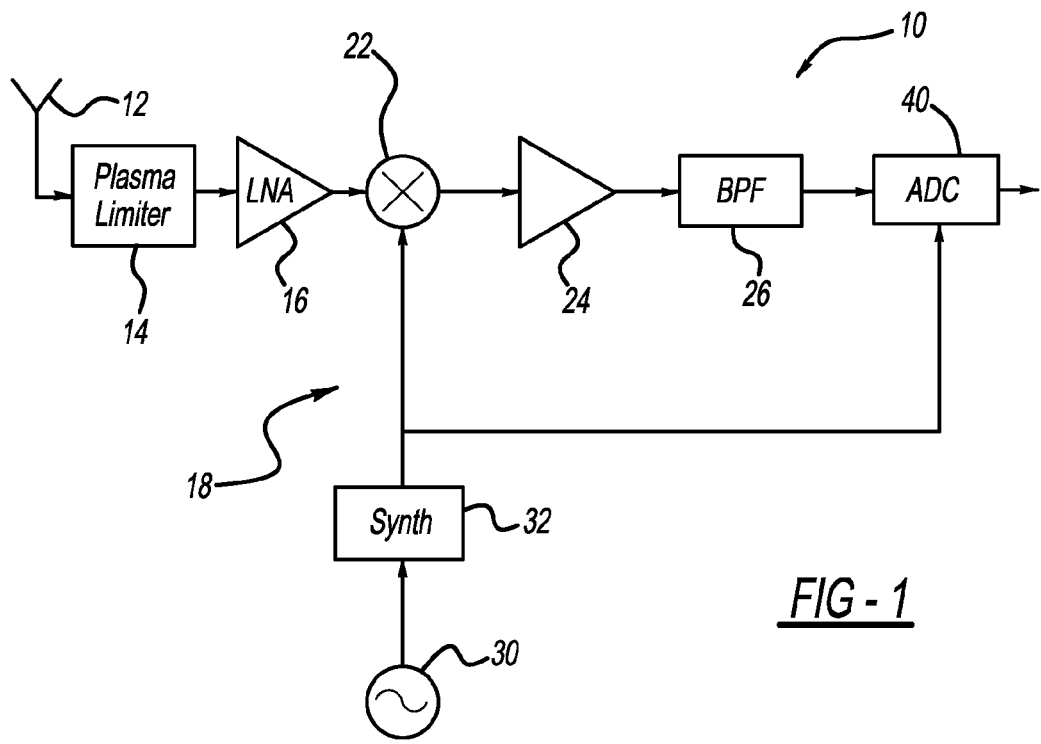
FIG. 1 is a schematic diagram of a front end of a receiver.

FIG. 1 is a simple schematic block diagram of a front end of a receiver 10 that could have many applications, such as wireless communication applications. The receiver 10 is intended to represent any receiver operated at any desirable frequency and being responsive to signals from any suitable source. The receiver 10 includes an antenna 12 that receives the signals to be processed by the receiver 10. The antenna 12 can be any antenna suitable for the purposes discussed herein and can have different configurations for the particular frequency band of interest, as would be well understood by those skilled in the art. Signals received by the antenna 12 are first sent to a plasma power limiter 14 that protects sensitive electronics in the receiver 10, as will be discussed in detail below. In one non-limiting embodiment, the plasma power limiter 14 is a monolithic integrated circuit formed on the same wafer as other electrical circuits in the receiver 10 using wafer-level packaging so that the plasma power limiter 14 is fabricated during and using the same fabrication steps that fabricate those circuits on the wafer. In other embodiments, the power limiter 14 can be fabricated on a different wafer than other circuit components and also as a separate, discrete device.

Signals that are below a threshold power intensity are passed directly through the plasma power limiter 14 and received by an LNA 16 that amplifies the signals from the antenna 12 to a desired signal level for subsequent processing. The amplified signal is then sent to a frequency down-converter 18 that converts the high frequency received signal to an intermediate frequency (IF) signal suitable to be effectively converted to a digital signal. The frequency down-converter 18 includes a local oscillator (LO) 30, a mixer 22, an amplifier 24, a band-pass filter (BPF) 26 and a synthesizer 32. The amplified signal from the LNA 16 is sent to the mixer 22 along with a tuned LO signal provided by the LO 30 and tuned to the desired frequency by the synthesizer 32 to down-convert the higher frequency received signal to the IF frequency. The IF signal is band-pass limited by the BPF 26 to a particular frequency band, where the combination of the mixer 22 and the BPF 26 provide the desired frequency control of the IF signal during the down-conversion process. The band-pass filtered IF signal from the BPF 26 is sent to an analog-to-digital converter (ADC) 40 that converts the analog signal to a digital signal for subsequent processing at the back-end of the receiver circuit 10, where the ADC 40 receives the tuned LO signal from the synthesizer 32 as a timing signal.

Figure 2:
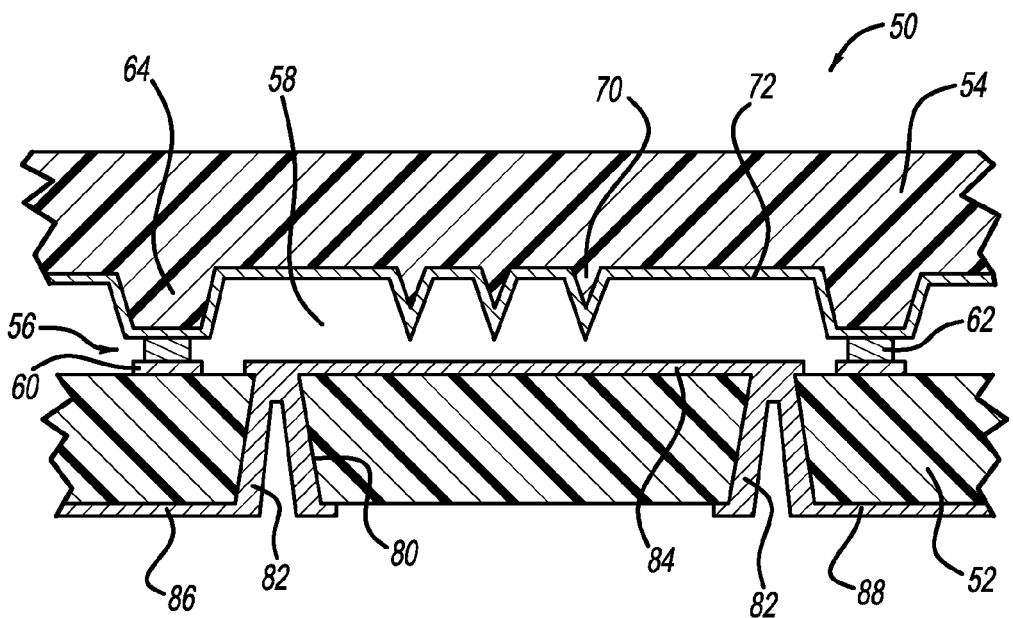
FIG. 2 is a cross-sectional view of a wafer-level integrated plasma power limiter including vertical probe tips that can be used in the circuit shown in FIG. 1.

FIG. 2 is a cross-sectional view of a plasma power limiter 50 that can be used as the plasma power limiter 14 in the receiver 10. Although the power limiter 50 has particular application for the receiver 10, this is by way of a non-limiting example in that the power limiter 50 can be used in any circuit where high intensity or high power signals may damage other circuits, including transmitter circuits. The plasma power limiter 50 includes a substrate wafer 52 and a cover wafer 54 that are sealed by a bonding layer 56 to define a hermetically sealed or non-hermetically sealed cavity 58 between the wafers 52 and 54 in a manner that is well understood by those skilled in the art. The wafers 52 and 54 can be any suitable wafer, such as group III-V semiconductors, silicon, etc. For example, the cover wafer 54 can be silicon and the substrate wafer 52 can be InP, SiC or GaAs. The bonding layer 56 can be any suitable combination of layers and materials to provide the hermetically sealed cavity 58, such as a gold layer 60 provided on the substrate wafer 52 and a gold layer 62 provided on the cover wafer 54, where a low temperature bonding process is employed to bond the layers 60 and 62 to form the bonding layer 56 in a process well understood by those skilled in the art. A perimeter section 64 of the cover wafer 54 provides the dimension to define the size of the cavity 58 in a manner also well understood by those skilled in the art.

According to one embodiment, during the sealing process to provide the cavity 58, the wafers 52 and 54 are placed in a chamber, and a suitable ionizable gas, such as an inert gas, for example, argon, is provided in the chamber so that it is sealed within the cavity 58. In an alternate embodiment, the cavity 58 is not hermetically sealed, but encloses ambient gas or air, which allows for a larger cavity. This can be done by providing holes through the wafers 52 or 54 or by constructing a partial ring. Further, prior to the cover wafer 54 being sealed to the substrate wafer 52, the cover wafer 54 is micro-machined to form a series of vertical probe tips 70, also referred to herein as plasma triggers. The probe tips 70 are formed so that when the wafers 52 and 54 are bonded together, the probe tips 70 extend towards the substrate wafer 52 a controlled distance for reasons that will become apparent from the discussion below. Further, prior to the wafers 52 and 54 being bonded together, a metallic coating or layer 72 is deposited on the cover wafer 54 to provide an electrically conductive path for sinking the high powered signals, and to prolong the life of the probe tips 70 that receive the concentrated electrical signal when the plasma is generated by ionization of the gas in the sealed cavity 58. The metallic layer 72 can be any suitable conductive material, such as aluminum, copper, tungsten, nickel, refractory metals, etc.

Prior to the wafers 52 and 54 being sealed together, the substrate wafer 52 is fabricated to form vias 80 through the wafer 52, which are then metalized by a suitable via metal 82, such as copper. One or more microstrip lines 84 are deposited on a surface of the substrate 52 that will face the cavity 58, where the microstrip lines 84 are electrically coupled to the via metals 82. The microstrip line 84 is sized and dimensioned for the particular frequency of the receiver 10 or other architecture in which the power limiter 50 will be employed so that the microstrip line 84 has low impedance for the signal propagating along the line 84. An input signal line 86 is deposited on a bottom surface of the substrate wafer 52 opposite to the cavity 58 and is directly coupled to the antenna 12. An output signal line 88 also deposited on the bottom surface of the substrate wafer 52 opposite to the cavity 58 is electrically coupled to the output via metal 82 on the side of the wafer 52 opposite to the cavity 58 so that it receives the signal propagating through a microstrip line 84.

During operation of the power limiter 50, those signals received by the antenna 12 that are at a low enough intensity so as to not ionize the gas within the cavity 58 propagate directly through the power limiter 50 along the microstrip line 84 as described with little or no loss. If the intensity or power of the received signal is high enough to ionize the gas within the cavity 58, which is designed to be at a lower potential than could damage the front-end components in the receiver 10, propagation of the high intensity signal along the microstrip line 84 will ionize the gas within the cavity 58, which generates a plasma discharge that is conductive and allows current flow from the line 84 to the probe tips 70. Once the gas in the cavity 58 is ionized to generate a conductive path across the cavity 58, the power of the signal still needs to be above some threshold, which is related to how much of the gas is ionized, to provide the current flow through the gas, which is based on various factors discussed in more detail below. The metallic layer 72 is electrically coupled to a ground or reference potential so that current received by the probe tips 70 can flow to that potential.

The probe tips 70 provide a control architecture for determining the amount of power that the plasma power limiter 50 will allow to propagate therethrough. Without the probe tips 70, the microstrip line 84 and the metallic coating 72 would operate as parallel plates and the distance between those plates would determine whether current would conduct across the cavity 58 if the gas were ionized. By providing the probe tips 70 that extend into the cavity 58, the probe tips 70 act as an electromagnetic field concentrator and the distance between the probe tips 70 and the microstrip line 84 determines how easily current will flow from the microstrip line 84 to the metallic coating 72 when the gas is ionized. The distance between the probe tips 70 and the microstrip line 84 and the gas used are thus designed to set what power level the plasma power limiter 50 is to be activated. Further, other criteria go into the design of when the plasma power limiter 50 is activated, including the number of probe tips 70, the material of the metallic layer 72, the space between probe tips 70, etc. The metallic layer 72 is selected not only for its current carrying properties, but also for its ability to withstand the arcing environment generated by the plasma for longevity purposes.

The plasma power limiter 50 offers one design that is applicable to sink current using an ionizable gas in a wafer-level processing configuration. The location, orientation, size, etc. of the plasma triggers can be changed for different fabrication techniques within the scope of the present invention.

Figure 3:
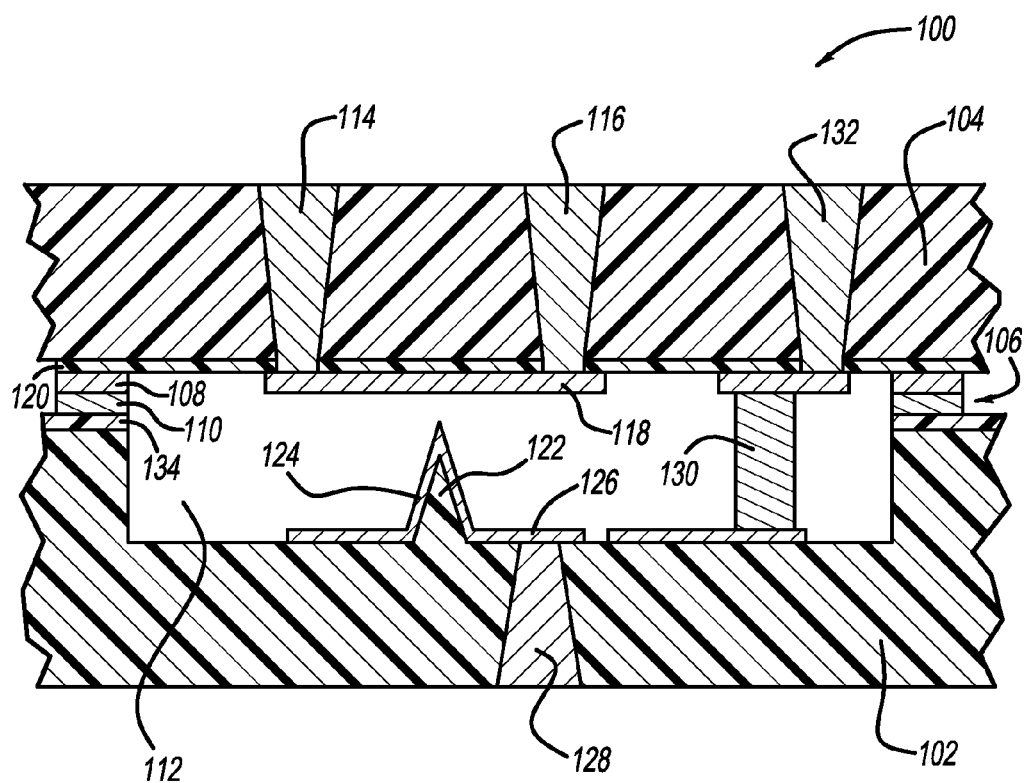
FIG. 3 is a cross-sectional view of a wafer-level integrated plasma power limiter including a vertical probe tip.

FIG. 3 is a cross-sectional view of a plasma power limiter 100 having a different design than the plasma power limiter 50, but which operates under the same principle. The plasma power limiter 100 is shown prior to being "flipped" for mounting purposes, where the wafer that includes the plasma trigger is at the bottom and is referred to as a trigger substrate 102 and the wafer that includes the signal line is at the top and is referred to as a signal substrate 104. The substrates 102 and 104 are sealed by a bonding layer 106 that includes gold layers 108 and 110 in the same manner as discussed above to define a hermetically or non-hermetically sealed cavity 112 including the ionizable gas. The signal received by the antenna 12 is sent to an input via 114 extending through the substrate 104 and exits the cavity 112 through an output via 116 extending through the substrate 104, where the vias 114 and 116 are electrically coupled by a microstrip line 118 in the cavity 112. The microstrip line 118 can be any suitable metal for the purposes described herein. An insulating layer 120, such as silicon nitride, is deposited on the surface of the signal substrate 104 facing the cavity 112 and provides electrical isolation for the microstrip line 118, and an insulating layer 134, such as silicon nitride, is deposited on the surface of the trigger substrate 102 facing the cavity 112.

The trigger substrate 102 includes a plasma trigger 122 having a metalized coating 124 that is electrically coupled to an electrode 126. When the gas in the cavity 112 is ionized and generates a plasma as a result of a high power signal propagating on the microstrip line 118, current flow across the cavity 112 is received by the plasma trigger 122 consistent with the discussion herein. The limiter 100 can sink that current flow in any suitable manner for the particular device. For example, the electrode 126 can be electrically coupled to a metal via 128 extending through the trigger substrate 102 that would be electrically coupled to a ground potential. Alternately, the electrode 126 can be electrically coupled to an intra-cavity interconnect (ICIC) 130 crossing the cavity 112 and being electrically coupled to a metal output via 132 extending through the substrate 104.

Although not specifically shown, it is also possible to provide electrodes or other top metals on the insulating layer 120 electrically isolated from the microstrip line 18 that can receive the current generated by the ionization of the gas, where that current flow could be directed to the via 132 or through the ICIC 130 and the via 128. In yet another embodiment, the electrode 126 can be spaced a distance from a ring surrounding the plasma trigger 122 where ionization of the gas allows the current to travel across the gap between the electrode 126 and the ring, and be removed from the plasma limiter 100

Other embodiments for various plasma power limiters will be described below that operate on the same basic principle as discussed above, where the power limiter can be integrated on a wafer with other circuit components. Thus, the various materials, processes, layer thicknesses, components, etc. discussed above may be applicable to those embodiments discussed below.

Figure 4:
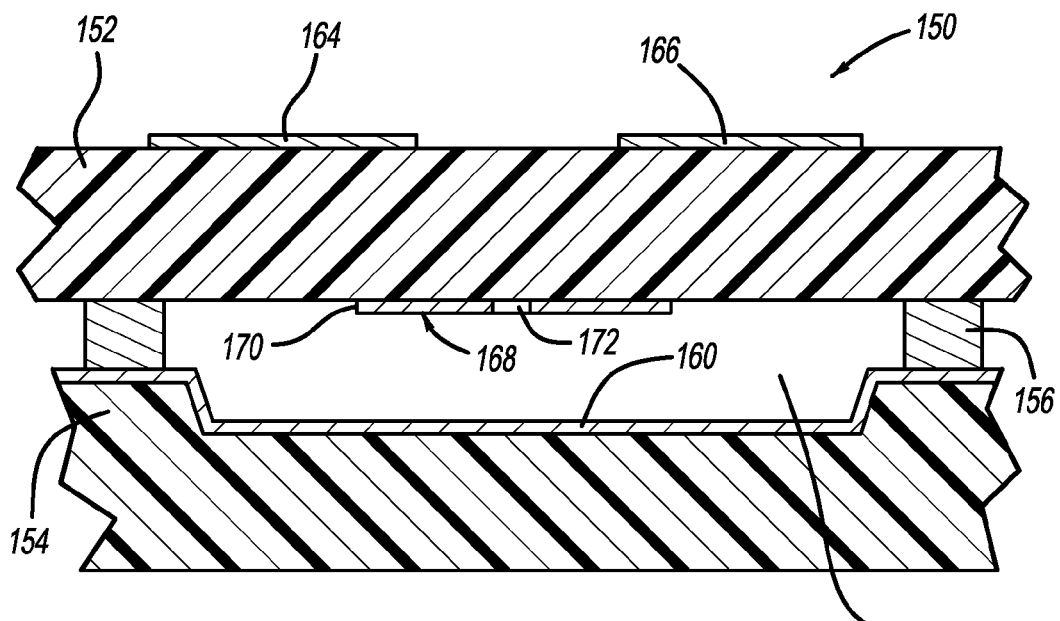
FIG. 4 is a cross-sectional view of a wafer-level integrated plasma power limiter including a split ring resonator.
Figure 5:
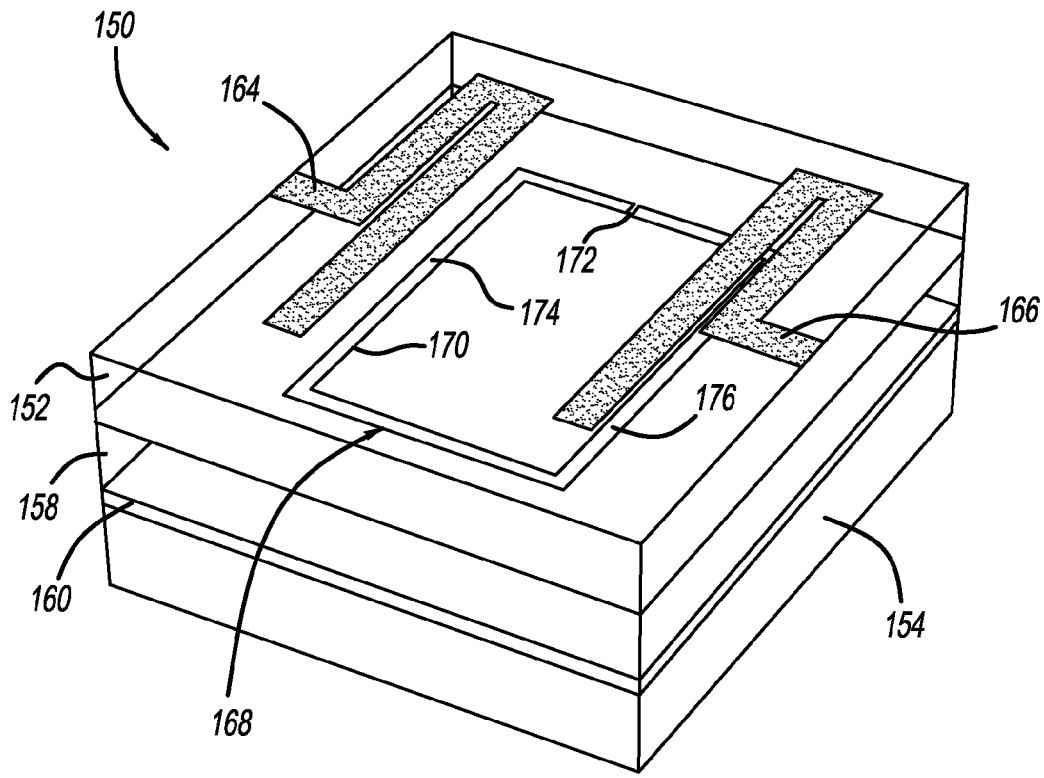
FIG. 5 is an isometric line drawing of the plasma power limiter shown in FIG. 4.

FIG. 4 is a cross-sectional view and FIG. 5 is an isometric line drawing of a resonant filter plasma power limiter 150 that includes a dielectric signal substrate 152 and a ground substrate 154 that are sealed together by a metal bonding ring 156 to define a hermetically sealed cavity 158 between the substrates 152 and 154 in which an ionizable gas is contained as discussed above. In an alternate embodiment, the cavity 158 does not need to be hermetically sealed. The bonding ring 156 is not shown in FIG. 5. A ground metal layer 160 is deposited and configured on the ground substrate 154 within the cavity 158 prior to the substrates 152 and 154 being bonded together and is electrically coupled to the metal bonding ring 156, as shown. An input signal transmission line 164 and an output signal transmission line 166 are deposited and configured in the shape shown to be electrically separated on a surface of the signal substrate 152 opposite to the cavity 158 prior to the substrates 152 and 154 being bonded together. A split ring resonator 168 including a ring electrode 170 that is not completely closed to have a gap 172 is deposited and configured on a surface of the signal substrate 152 facing the cavity 158 also prior to the substrates 152 and 154 being bonded together, where the ring electrode 170 includes an input leg 174 and an output leg 176. A split ring resonator of this type is a well known device where the size of the electrode 170 and the width of the gap 172 is specifically selected for the wavelength of the signals propagating on the electrode 170 so that signals reflected from edges of the gap 172 constructively interfere to provide signal resonation. As such, split ring resonators are often employed in the art as bandpass filters.

An input signal on the input signal line 164 is capacitively coupled to the input leg 174 of the split ring resonator 168 and a signal on the resonator 168 is capacitively coupled from the output leg 176 of the resonator 168 to the output signal line 166. Thus, as long as the signal continues to resonate with the resonator 168 at low power levels, the input signal on the line 164 is output on the output line 166 with little loss. If the power of the input signal on the input line 164 exceeds some ionization threshold, the gas within the cavity 158 ionizes in the gap area of the resonator 168 creating a plasma discharge, which causes the resonator 168 to stop resonating, and thus prevents a significant portion of the input signal propagating on the resonator 168 from being coupled to the output line 166. More particularly, at high power signal power levels, the split ring resonator 168 generates a large voltage swing across the gap 172, which causes the gas in the cavity 158 to ionize and generate a plasma discharge. The ionized gas loads and detunes the split ring resonator 168, which limits the amount of power that is coupled to the output transmission line 166 from the resonator 168. The plasma discharge also allows the input signal coupled to the resonator 168 to be conductively coupled across the cavity 158 to the metal layer 160 in the manner discussed above.

Figure 6:
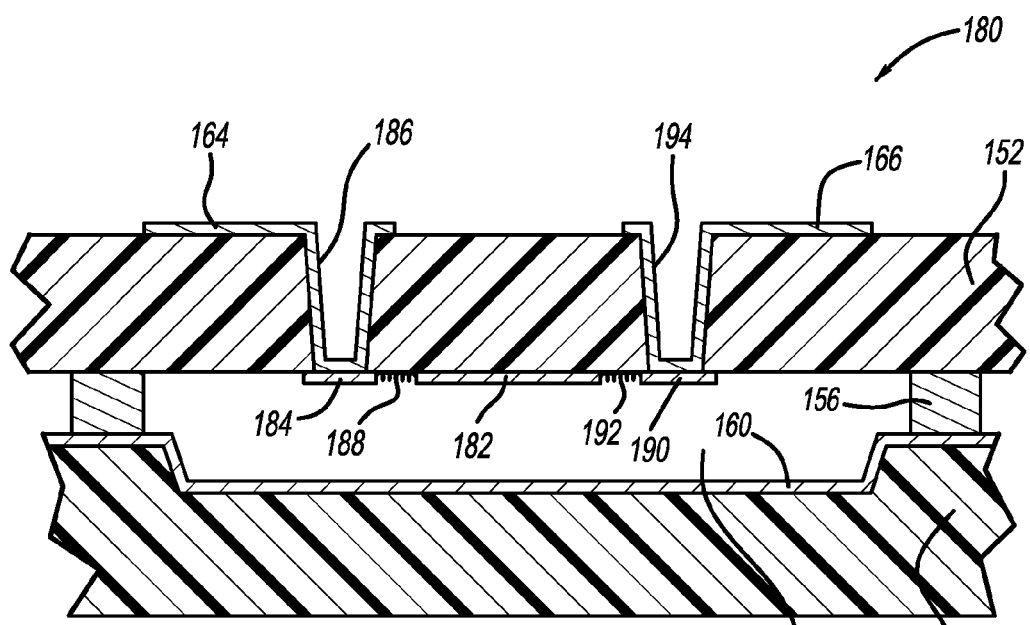
FIG. 6 is a cross-sectional view of a wafer-level integrated plasma power limiter including an impedance transform line.
Figure 7:
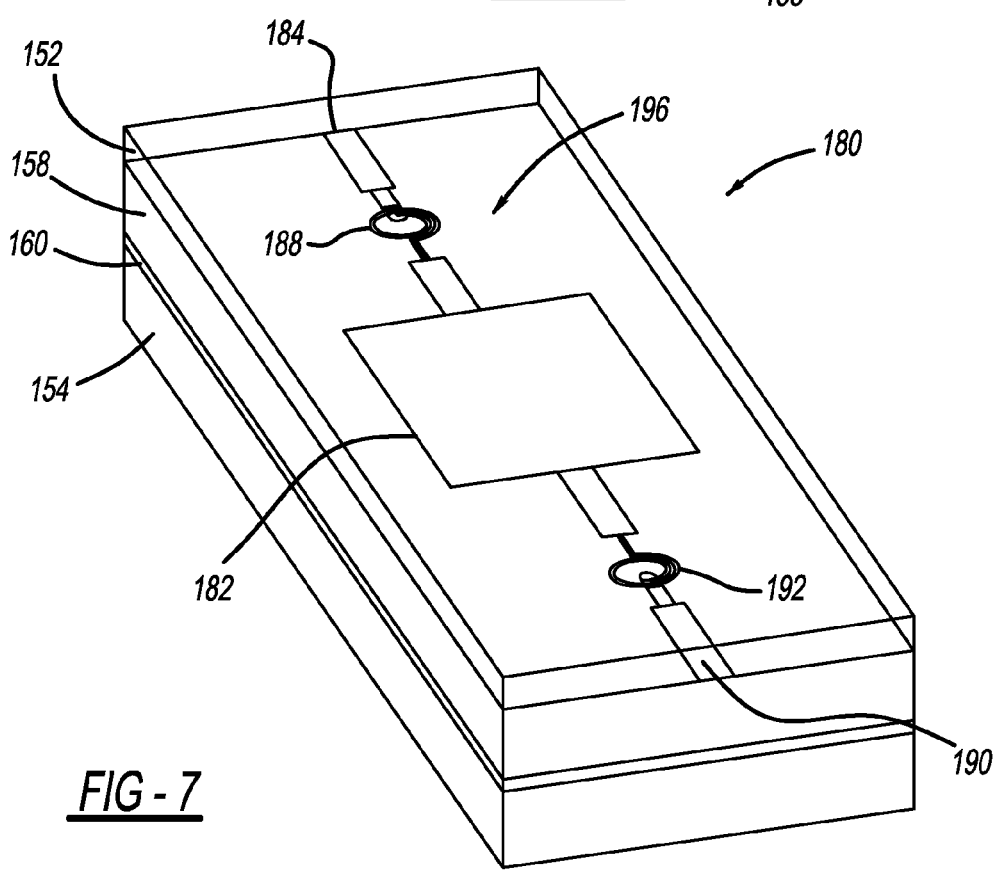
FIG. 7 is an isometric line drawing of the plasma power limiter shown in FIG. 6.

FIG. 6 is a cross-sectional view and FIG. 7 is an isometric line drawing of an impedance transform plasma power limiter 180 similar to the power limiter 150, where like elements are identified by the same reference number, and where the split ring resonator 168 is replaced with a high impedance transmission line 196 having a high impedance electrical element 182. The input signal line 164 is impedance matched to the input side of the limiter 180 and the output signal line 166 is impedance matched to an output side of the limiter 180 at the system impedance, such as 50Ω, but the high impedance element 182 has a higher impedance than the system impedance.

The input signal transmission line 164 is electrically coupled to an input line portion 184 in the high impedance transmission line 196 through a metal via 186 extending through the signal substrate 152. The input line portion 184 is impedance matched to the high impedance element 182 by an inductive element 188. Likewise, the high impedance element 182 is impedance matched to an output line portion 190 in the transmission line 196 by an inductive element 192 that is electrically coupled to the output signal transmission line 166 by a metal via 194 extending through the substrate 152. In an alternate embodiment, the vias 186 and 194 can be eliminated where the input line 164 and the output line 166 are capacitively coupled to the transmission line 196 through the substrate 152. Also, the configuration of the high impedance transmission line 196 is by way of a non-limiting example in that any suitable electrical circuit can be employed to impedance match the lines 164 and 166 to the element 182, including providing impedance matching elements outside of the cavity 158. As such, the input signal line 164 and the output signal line 166 are transformed from the impedance of the electrical system to a higher impedance propagating along the signal path outside of the cavity 158, inside the cavity 158 or both. It is noted that the input transmission line 164, the vias 186 and 194 and the output transmission line 166 are not shown in FIG. 7.

For a particular power level of the input signal and a particular impedance of the high impedance element 182 a certain voltage potential will be created between the high impedance element 182 and the ground plane 160, where the higher the impedance of the element 182 the greater the voltage potential. At low power levels, the voltage potential is not high enough to ionize the gas in the cavity 158, and the signal propagates from the input signal transmission line 164 through the high impedance transmission line 182 to the output signal transmission line 166 at low loss. At a high enough voltage potential, the high impedance transmission line 196 develops a large enough voltage swing and the gas in the cavity 158 is ionized creating a plasma discharge, and thus a conductive path from the element 182 to the ground plane 160 that prevents high power signals from being output on the output line 166. In other words, the ionized gas loads and detunes the high impedance transmission line 196, which limits signal propagation to the output transmission line 166. Depending on how large of a voltage swing across cavity 158 the system is designed for, the impedance of the high impedance element 182 can be between 100Ω to several kilo-ohms, where a higher impedance reduces the bandwidth of the power limiter 180.

Figure 8:
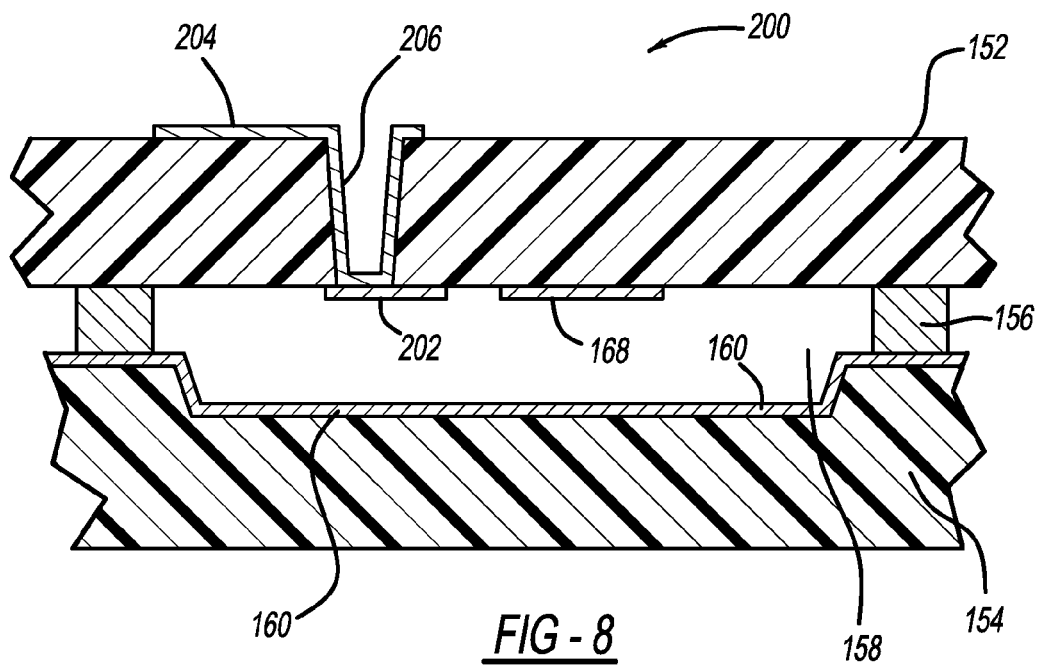
FIG. 8 is a cross-sectional view of a wafer-level integrated plasma power limiter including a pilot light electrode.
Figure 9:
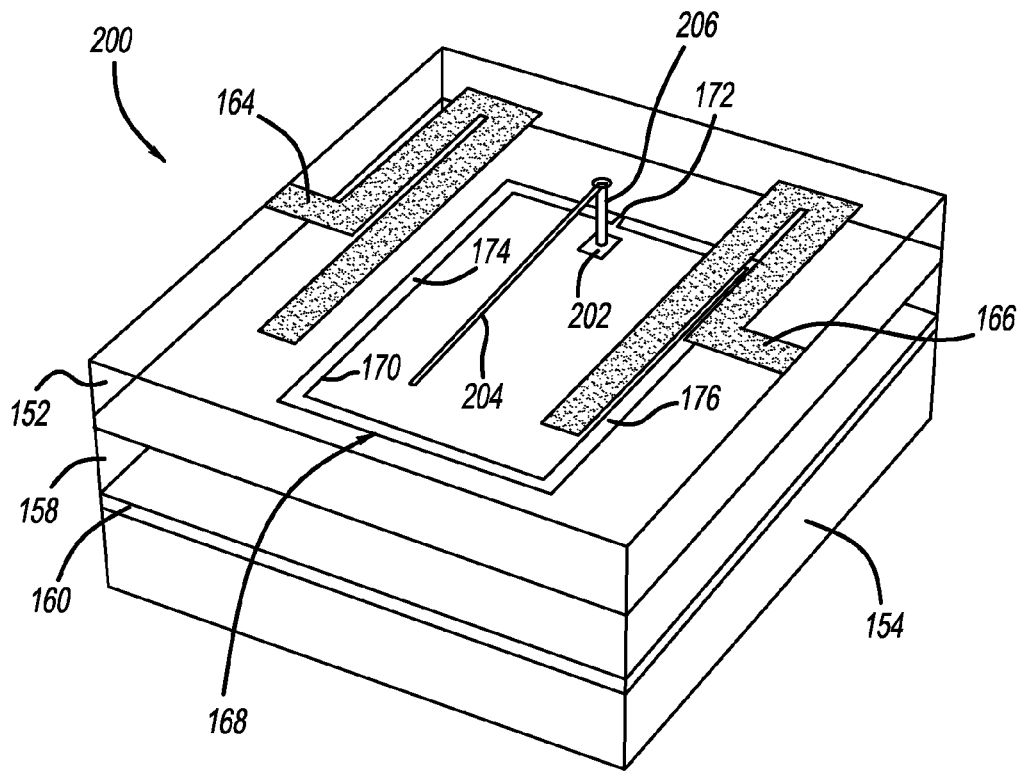
FIG. 9 is an isometric line drawing of the plasma power limiter shown in FIG. 8.

According to other embodiments of the invention, the ionization state of the gas in the cavity 158 is increased so that it is closer to the ionization level provided by the high power signal. FIG. 8 is a cross-sectional view and FIG. 9 is an isometric line drawing of a plasma power limiter 200 similar to the power limiter 150, where like elements are identified by the same reference number. It is noted that the orientation of FIG. 8 is rotated 90° relative to the orientation of FIG. 4. The power limiter 200 includes a plasma pilot light electrode 202 fabricated and configured on a surface of the signal substrate 152 facing the cavity 158 prior to the substrates 152 and 154 being bonded together and positioned adjacent to the gap 172 of the resonator 168. In an alternate embodiment, the resonator 168 can be replaced with a simple transmission line or the high impedance transmission line 196 consistent with the discussion herein. The pilot electrode 202 is electrically coupled to a pilot light bias line 204 fabricated and deposited on the substrate 152 by a metal via 206 that extends through the substrate 152.

A large DC bias voltage or an alternating current signal is applied to the pilot light bias line 204, which energizes the pilot electrode 202 and discharges the ionizable gas in the cavity 158. The pilot light bias signal is selected so that the pilot light electrode 202 generates a low electron density plasma discharge that reduces the signal power threshold for operation of the limiter 200, where the pilot light electrode 202 is positioned near the gas ionization around the gap 172. In other words, the pilot light electrode 202 is operated at low power to sustain a low electron density that does not interfere with the transmission of low power signals through the power limiter 200. More particularly, by appropriately selecting the current of the bias signal, the plasma in the cavity 158 can have a low enough electron density so that the low plasma discharge does not interfere with the resonance of the resonator 168. The pilot light plasma ensures the presence of free electrons that facilitate the ionization avalanche process required to achieve a high electron density for limiting large signals. Thus, when a high power signal is provided on the input line 164, the voltage required to ionize the gas in the cavity 158 to a high electron density is reduced to provide quicker power limiting. Alternatively, multiple plasma pilot light electrodes can be employed to achieve a discharge between pilot light electrodes in addition to or in place of a plasma discharge to the ground plane 160.

In other embodiments, an electrical bias that raises the ionization state of the gas can be applied directly to the input signal line 164 or the transmission line in the cavity to alter or control the characteristics of the gas ionization process and resulting plasma discharge without the need for the pilot light electrode. Any suitable electrical configuration can be provided in the plasma power limiters discussed herein to provide this electrical bias. The circuitry that provides the electrical bias can be provided by external filter elements separate from the signal substrate 152 or can be monolithically formed on the signal substrate 152.

Figure 10:
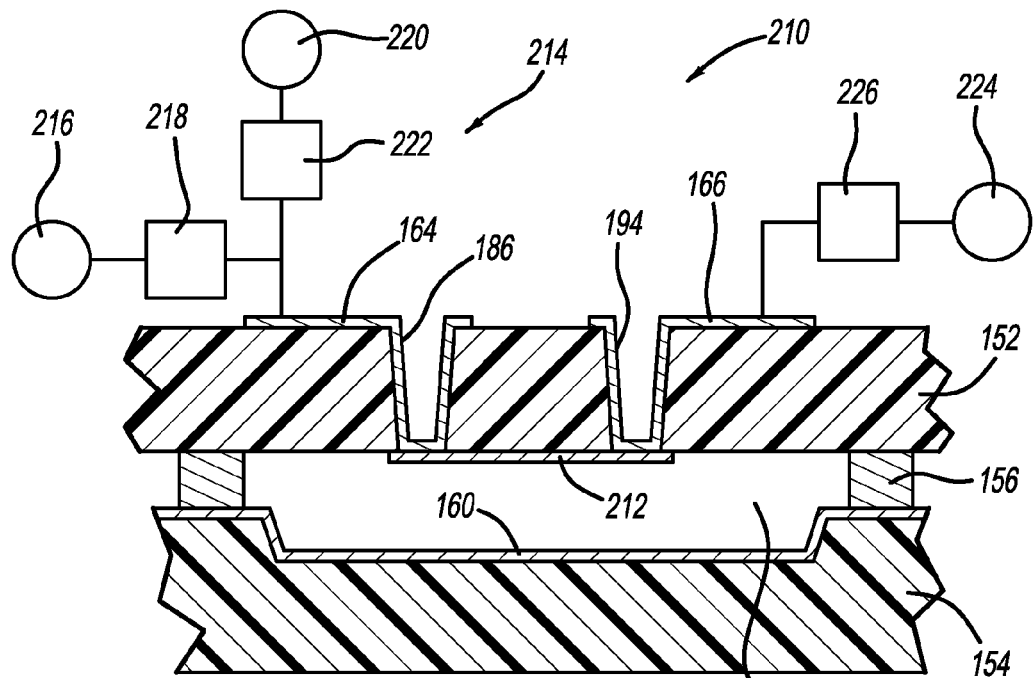
FIG. 10 is a cross-sectional view of a wafer-level integrated plasma power limiter including a bias circuit.

FIG. 10 is a cross-sectional view of a plasma power limiter 210 similar to the plasma power limiter 180, where like elements are identified by the same reference number, and where the electrical bias and filtering elements that separate the DC bias from RF input signals are provided by off-chip components. In this embodiment, a simple transmission line 212 is formed on the surface of the signal substrate 152 facing the cavity 158 that is electrically coupled to the vias 186 and 194, and that is impedance matched to the system impedance. The power limiter 210 employs a bias-T circuit 214 that provides the electrical bias and filtering. The bias-T circuit 214 receives an alternating current from signal source 216 electrically coupled to the input signal line 164 through a direct current blocking filter 218, such as a capacitor, and a direct current source 220 electrically coupled to the input signal line 164 through an alternating current signal blocking filter 222, such as an inductor. Alternately, the direct current source 220 and the blocking filter 222 can be placed on the output signal line 166. An output signal load 224 is electrical coupled to the output signal line 166 through a direct current blocking filter 226, such as a capacitor. The bias signal provided by the bias-T circuit 214 increases the ionization state of the gas in the cavity 158, and is electrically isolated from the input signal provided on the input line 164.

Figure 11:
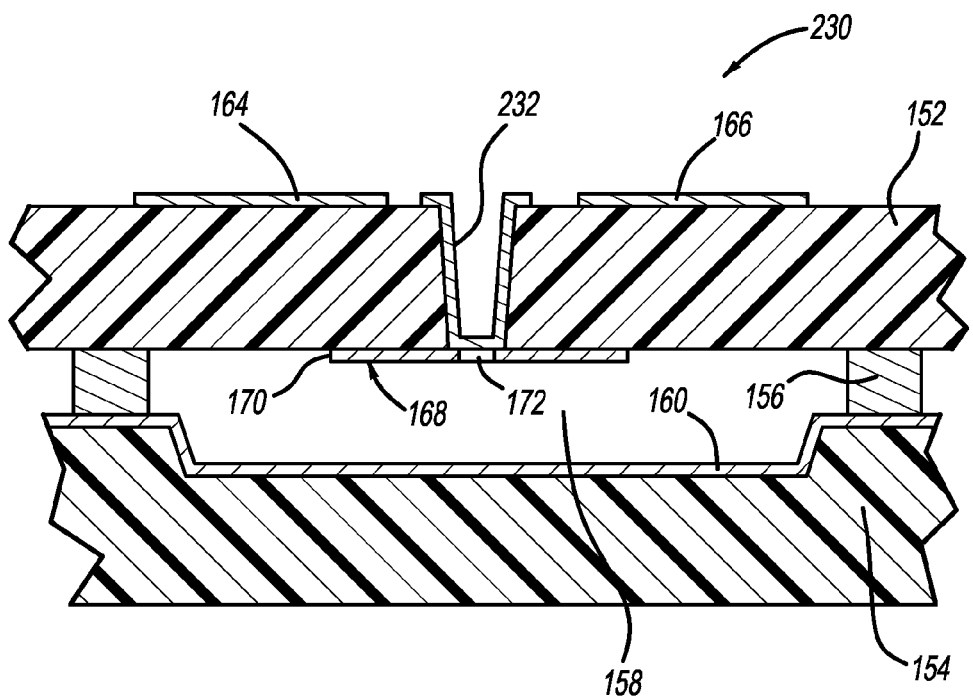
FIG. 11 is a cross-sectional view of a wafer-level integrated plasma power limiter including a biased split ring resonator.
Figure 12:
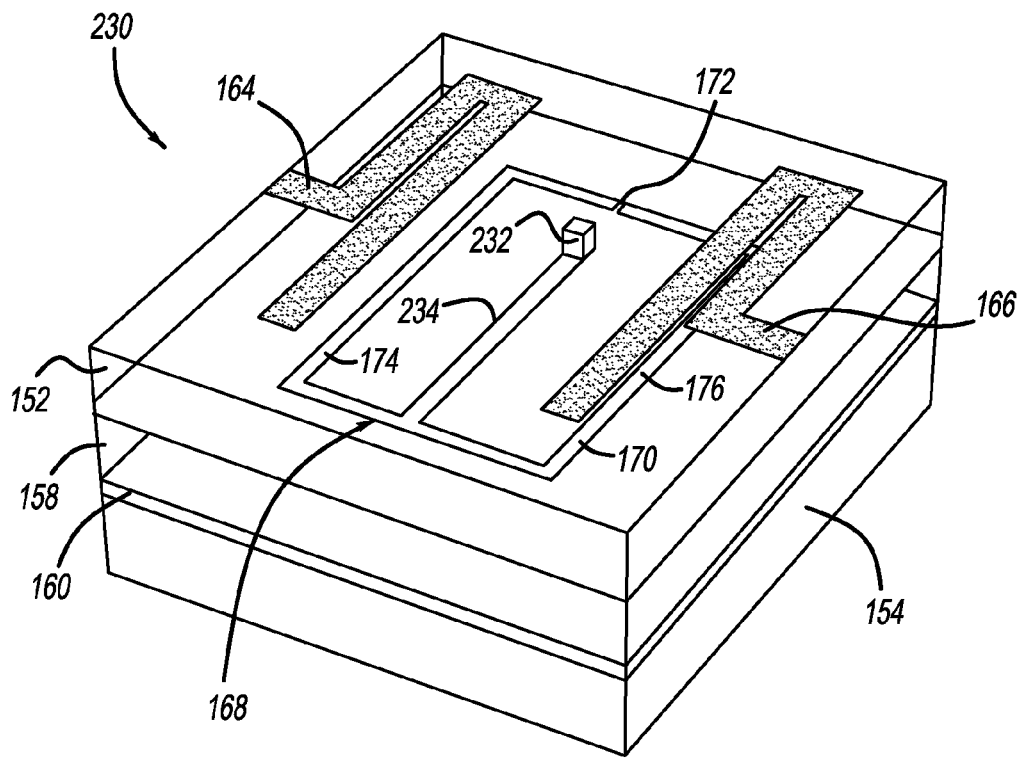
FIG. 12 is an isometric line drawing of the plasma power limiter shown in FIG. 11.

Such a DC bias for raising the ionization state of the gas in the cavity 158 as described above can also be applied to the split ring resonator 168 in the power limiter 150. FIG. 11 is a cross-sectional view and FIG. 12 is an isometric line drawing of a power plasma limiter 230 similar to the plasma power limiter 150, where like elements are identified by the same reference number. A DC bias signal is provided to a signal line 234 provided in the cavity 158 that is electrically coupled to the resonator 168 between the legs 174 and 176 through a via 232 extending through the signal substrate 152. The DC bias signal can be provided to the via 232 in any suitable manner.

A plurality of the plasma power limiters can be cascaded in series where each plasma limiter may or may not be designed for a different power level to provide further protection for the circuitry behind the plasma limiters. For example, if a high intensity signal is received by the plasma limiter, where the gas is ionized and current is sinked to ground, some of the current still may flow out of the plasma limiter on the output signal line and still be at high power. Another plasma limiter that receives that signal could provide further protection. Additionally, the cascaded plasma limiters could be designed to be activated at different voltage thresholds so that the monolithically integrated circuit that included the plasma limiters could be provided for a variety of different applications.

Figure 13:
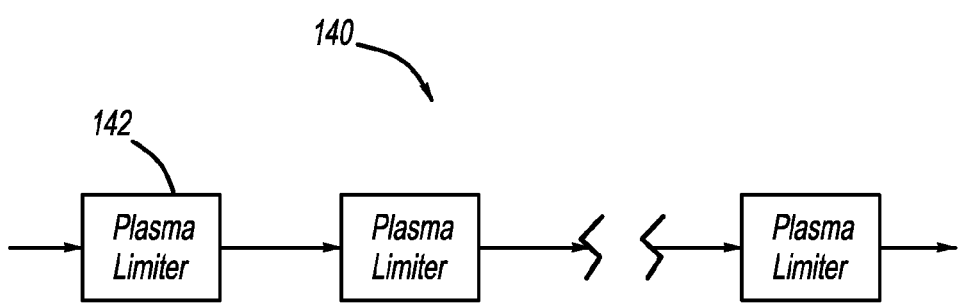
FIG. 13 is a block diagram of a plasma power limiter circuit including a plurality of cascaded plasma power limiters.

FIG. 13 is a block diagram of a plasma power limiter circuit 140 including a plurality of series connected plasma power limiters 142 to illustrate cascaded plasma power limiters as discussed above. The plasma limiters 142 can be any plasma power limiter consistent with the discussion herein, such as the plasma power limiters 50, 100, 150, 180, 200, 190 and 230. The power limiters 142 can be the same design or different designs and can have the same or different activation thresholds, where the plasma triggers could be spaced at different distances from the signal line in each of the power limiters 142. Further the number and type of plasma triggers in each of the power limiters 142 could be the same or different to provide the same or different activation thresholds.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A plasma power limiter comprising:
a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss; and
a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line, wherein the power limiter is fabricated using wafer-level fabrication techniques where the power limiter is formed at the same time as other circuit elements.

2. The power limiter according to claim 1 wherein the signal transmission line is a high impedance transmission line including a high impedance element having a higher impedance than the input signal line and the output signal line, said power limiter including impedance matching elements for impedance matching the input and output signal lines to the high impedance element.

3. The power limiter according to claim 1 further comprising a plasma pilot light electrode formed on the second side of the signal substrate and a plasma pilot light bias line formed on the first side of the signal substrate and being electrically coupled through the signal substrate to the pilot light electrode, wherein a bias signal provided on the pilot light bias line causes the pilot light electrode to generate a low electron density plasma discharge in the cavity that reduces the threshold power level.

4. The power limiter according to claim 1 further comprising a DC voltage bias line formed on the first side of the signal substrate and being electrically coupled through the signal substrate to the signal transmission line, wherein a bias voltage provided on the bias line causes the signal transmission to generate a low electron density plasma discharge in the cavity that reduces the threshold power level.

5. The power limiter according to claim 1 further comprising an electrical bias circuit that provides an electrical bias to the input signal line that increases the ionization state of the gas in the cavity.

6. The power limiter according to claim 5 wherein the bias circuit includes an alternating current signal electrically coupled to the input signal line through a direct current blocking filter, a direct current source electrically coupled to the input signal line through an alternating current signal blocking filter, and an output signal load electrically coupled to the output signal line through a direct current blocking filter.

7. The power limiter according to claim 1 wherein the input signal line and the output signal line are capacitively coupled to the signal transmission line through the signal substrate.

8. The power limiter according to claim 1 wherein the input signal line and the output signal line are electrically coupled to the signal transmission line by metal vias extending through the signal substrate.

9. The power limiter according to claim 1 wherein the power limiter is part of a receiver front end between an antenna and a low noise amplifier.

10. The power limiter according to claim 1 wherein the power limiter is one of a plurality of plasma power limiters electrically coupled in series.

11. The power limiter according to claim 10 wherein the plurality of plasma power limiters have different activation thresholds.

12. A plasma power limiter comprising:
a signal substrate having a first side and a second side, said signal substrate including an input signal line formed on the first side of the signal substrate, a split ring resonator formed on the second side of the signal substrate and an output signal line formed on the first side of the signal substrate, said split ring resonator including a gap, wherein an input signal at a power level less than a threshold power level propagating on the input signal line is electrically coupled to the split ring resonator and a signal propagating on the split ring resonator is electrically coupled to the output signal line with low loss; and a ground substrate having a first side and a second side, said ground substrate being bonded to the signal substrate to form a sealed cavity therebetween, where the second side of the signal substrate faces the second side of the ground substrate within the cavity, said ground substrate including a ground metal layer formed on the second side of the ground substrate, said cavity being filled with an ionizable gas, wherein the input signal propagating on the input signal line at a power level greater than the threshold power level causes the split ring resonator to generate a large voltage swing across the gap that ionizes the gas within the cavity and generates a plasma discharge, which limits power of the output signal coupled to the output signal line.

13. The power limiter according to claim 12 wherein the input signal line and the output signal line are capacitively coupled to the split ring resonator through the signal substrate.

14. The power limiter according to claim 12 further comprising a plasma pilot light electrode formed on the second side of the signal substrate and a plasma pilot light bias line formed on the first side of the signal substrate and being electrically coupled through the signal substrate to the pilot light electrode, wherein a bias signal provided on the pilot light bias line causes the pilot light electrode to generate a low electron density plasma discharge in the cavity that reduces the threshold power level.

15. The power limiter according to claim 12 further comprising a DC voltage bias line formed on the first side of the signal substrate and being electrically coupled through the signal substrate to the split ring resonator, wherein a bias signal provided on the bias line causes the split ring resonator to generate a low electron density plasma discharge in the cavity that reduces the threshold power level.

16. A plasma power limiter comprising:
a signal substrate having a first side and a second side, said signal substrate including an input signal line formed on the first side of the signal substrate, a high impedance transmission line having a high impedance element formed on the second side of the signal substrate and being electrically coupled and impedance matched to the input signal line, and an output signal line formed on the first side of the signal substrate and being electrically coupled and impedance matched to the high impedance transmission line, wherein an input signal at a power level less than a threshold power level propagating on the input signal line is electrically coupled to the high impedance transmission line and a signal propagating on the high impedance transmission line is electrically coupled to the output signal line as an output signal with low loss; and
a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level causes the high impedance transmission line to ionize the gas within the cavity and generate a plasma discharge, which limits power of the output signal coupled to the output signal line.

17. The power limiter according to claim 16 wherein the high impedance transmission line includes a first impedance matching element that impedance matches the input signal line to the high impedance element and a second impedance matching element that impedance matches the output signal line to the high impedance element.

18. The power limiter according to claim 17 wherein the first and second impedance matching elements are provided within the cavity.

19. The power limiter according to claim 17 wherein the first and second impedance matching elements are provided on the first side of the signal substrate.

20. A plasma power limiter comprising:
a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss;
a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line; and
a plasma pilot light electrode formed on the second side of the signal substrate and a plasma pilot light bias line formed on the first side of the signal substrate and being electrically coupled through the signal substrate to the pilot light electrode, wherein a bias signal provided on the pilot light bias line causes the pilot light electrode to generate a low electron density plasma discharge in the cavity that reduces the threshold power level.

21. A plasma power limiter comprising:
a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss;
a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line; and a DC voltage bias line formed on the first side of the signal substrate and being electrically coupled through the signal substrate to the signal transmission line, wherein a bias voltage provided on the bias line causes the signal transmission to generate a low electron density plasma discharge in the cavity that reduces the threshold power level.

22. A plasma power limiter comprising:

a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss;

a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line; and an electrical bias circuit that provides an electrical bias to the input signal line that increases the ionization state of the gas in the cavity.

23. A plasma power limiter comprising:

a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss, wherein the input signal line and the output signal line are capacitively coupled to the signal transmission line through the signal substrate;

a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line.

24. A plasma power limiter comprising:

a signal substrate having a first side and a second side, said signal substrate including an input signal line formed on the first side of the signal substrate, a signal transmission line formed on the second side of the signal substrate and an output signal line formed on the first side of the signal substrate, wherein an input signal at a power level less than a threshold power level propagating on the input signal line is electrically coupled to the signal transmission line and a signal propagating on the signal transmission line is electrically coupled to the output signal line as an output signal with low loss; and a ground substrate having a first side and a second side, said ground substrate being bonded to the signal substrate to form a hermetically sealed cavity therebetween, where the second side of the signal substrate faces the second side of the ground substrate within the cavity, said ground substrate including a ground metal layer formed on the second side of the ground substrate, said cavity being filled with an ionizable gas, wherein the signal propagating on the input signal line at a power level greater than the threshold power level generates a voltage potential across the cavity that ionizes the gas and generates a plasma discharge, which limits a power of the output signal coupled to the output signal line, wherein the power limiter is part of a receiver front end between an antenna and a low noise amplifier.

* * * * *